United States Patent
Stier et al.

(10) Patent No.: US 6,698,072 B1
(45) Date of Patent: Mar. 2, 2004

(54) METHOD OF MANUFACTURING PIEZOELECTRIC ACTUATORS

(75) Inventors: Hubert Stier, Asperg (DE); Guenther Hohl, Stuttgart (DE); Friedrich Boecking, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/582,750

(22) PCT Filed: Jul. 29, 1999

(86) PCT No.: PCT/DE99/02335

§ 371 (c)(1),
(2), (4) Date: Oct. 23, 2000

(87) PCT Pub. No.: WO00/26972

PCT Pub. Date: May 11, 2000

(30) Foreign Application Priority Data

Nov. 3, 1998 (DE) .......................... 198 50 610

(51) Int. Cl.⁷ ............................... H04R 17/10
(52) U.S. Cl. .................. 29/25.35; 29/846; 29/851; 29/415; 310/328; 310/369
(58) Field of Search .................. 29/25.35, 851, 29/595, 415, 846; 427/58, 100, 376.2; 310/328, 369; 219/121.69, 121.68

(56) References Cited

U.S. PATENT DOCUMENTS

| 5,196,756 | A | * | 3/1993 | Kohno et al. ............... 310/328 |
| 5,568,679 | A | * | 10/1996 | Ohya et al. ................. 29/25.35 |
| 5,639,508 | A | * | 6/1997 | Okawa et al. ............... 427/100 |
| 6,065,196 | A | * | 5/2000 | Inoi et al. .................. 29/25.35 |
| 6,260,248 | B1 | * | 7/2001 | Cramer et al. ............. 29/25.35 |

FOREIGN PATENT DOCUMENTS

| DE | 37 13 697 | | 11/1988 | |
| DE | 43 06 073 | | 6/1994 | |
| DE | 195 00 706 | | 7/1996 | |
| DE | 195 34 445 | | 3/1997 | |
| EP | 0 550 829 | | 7/1993 | |
| EP | 0 736 386 | | 10/1996 | |
| JP | 64-25594 | * | 1/1989 | .................. 219/68 |
| WO | WO 97/40536 | * | 10/1997 | |

* cited by examiner

Primary Examiner—A. Dexter Tugbang
(74) Attorney, Agent, or Firm—Kenyon & Kenyon

(57) ABSTRACT

A method of manufacturing a plurality of piezoelectric actuators (1) includes the following operations: manufacturing of sheets (10) from a piezoelectric ceramic material, coating at least one surface of the sheets (10) with electrodes (3), stacking and pressing the sheets (10) to form a stack, sintering the stacked sheets (10), and separating the stack to form individual actuators (1). At least one cutout (11) for each actuator (1) is made in the sheets (10) prior to stacking and sintering, the cutouts (11) of the sheets (10) being arranged exactly flush one above the other in stacking.

12 Claims, 2 Drawing Sheets

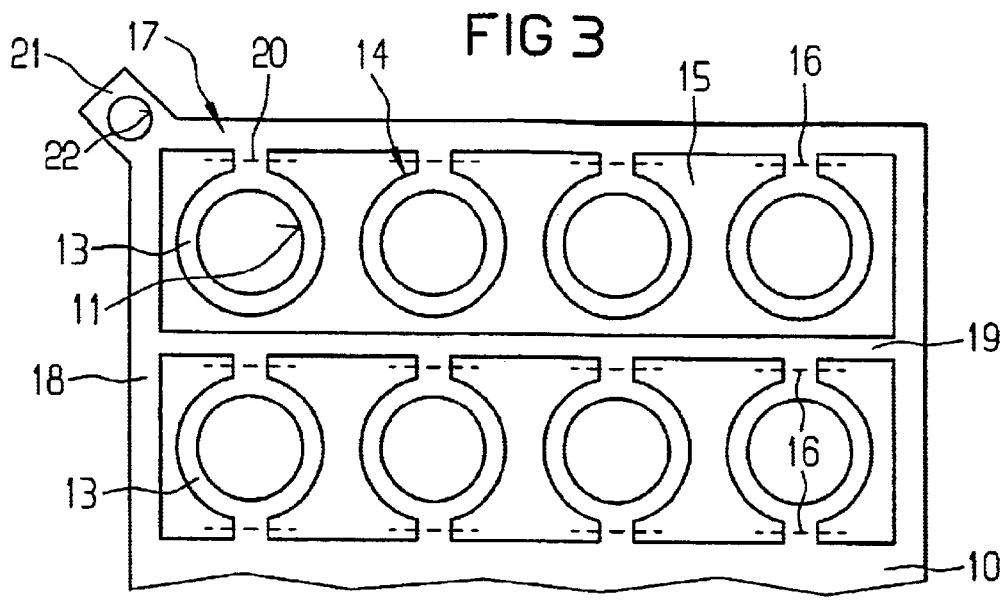
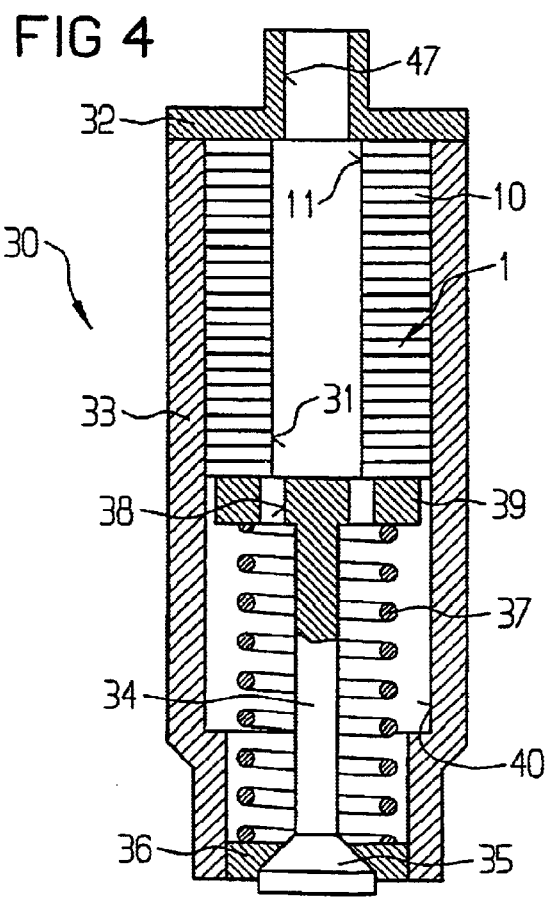

METHOD OF MANUFACTURING PIEZOELECTRIC ACTUATORS

BACKGROUND INFORMATION

The present invention is based on a method of manufacturing piezoelectric actuators, in particular for fuel injection valves, according to the definition of the species of the main claim.

Piezoelectric actuators, in particular for actuating fuel injection valves, are known in a plurality of designs, for example from German Patent Application 195 00 706 A1 or German Patent 43 06 073 C1. Piezoelectric actuators have a plurality of piezoelectric layers stacked one above the other, each one being coated with an electrode on the surface. Piezo actuators normally have hundreds of piezoelectric layers thus layered one above the other. A relatively large actuating lift is achieved in this manner. As described in detail, for example, in German Patent Application 37 13 697 A1, the electrodes of the individual piezoelectric layers must be alternatingly connected to a voltage source in order to generate an electric field oriented in the same direction in the individual layers. Every second electrode is connected to a first pole of a voltage source, while the electrodes in between are connected to a second pole of a voltage source.

German Patent Application 195 34 445 A1 describes piezoelectric actuators having a central through passage.

In manufacturing piezoelectric actuators, the common procedure is to initially manufacture thin sheets made of a piezoelectric ceramic material and to coat the surface of these sheets with electrodes via vapor deposition or sputtering. Then the sheets are stacked one above the other and pressed together. Subsequently the stacked sheets are sintered so that the individual layers are baked together. Finally the stacks are cut, for example by sawing, to form individual actuators.

Since the actuators used for actuating fuel injection valves must have a central passage for the fuel in order to achieve a compact design, previously this central passage was usually made using a material-removing operation after stacking and sintering, usually by drilling. This material-removing operation is, however, costly, since the sintered ceramic layers have a relatively high hardness. Previously, in addition, the central passage produced by drilling had to be subjected to a finishing operation by machining in order to avoid short-circuits between the electrodes. It is furthermore particularly disadvantageous that only round passages can be produced by drilling. In practice, however, it may be necessary to produce passages having other shapes. By sawing apart the stacked and sintered sheets to produce the individual actuators, actuators with a rectangular cross-section are obtained. When these actuators are installed in fuel injection valves having a hollow cylindrically shaped housing contour, actuators having a cylindrically shaped external contour have the advantage of requiring little space. In order to produce cylindrically shaped actuators having a round cross-section from the rectangular actuators produced by sawing, the actuators must be post-processed by cutting or turning, which is relatively expensive and increases manufacturing costs.

ADVANTAGES OF THE INVENTION

The method of manufacturing piezoelectric actuators according to the present invention having the characterizing features of Claim 1 has the advantage over the related art that the central passage of the individual actuators can be produced in a simple manner so that suitable cutouts are produced in the sheets prior to stacking and sintering, these cutouts then forming the central passage of the actuators after stacking. For this purpose, the sheets are arranged exactly flush to each other one above the other, which can be easily achieved using centering holes provided through the sheets, for example. The exact alignment of the sheets one above the other helps create a central passage having a smooth internal wall, which requires no subsequent processing. Therefore, the method according to the present invention can be used to particular advantage in mass production. No material-removing operation is required.

Another important advantage is that not only circular passages, but also passages having other contours, can be produced.

The measures presented in the subclaims allow advantageous refinements of and improvements in the method described in Claim 1.

Using the method according to the present invention, not only the internal contours of the central passage, but also the outer contours of the actuators can be pre-shaped. For this purpose, each sheet is shaped prior to stacking so that these have a plurality of actuator areas which form the actuators after stacking, these areas being connected to a frame area which holds the actuator areas together. Outside the connecting webs, the actuator areas already have their final contour, the areas outside the actuator areas, the connecting webs, and the frame area being separated from the sheets by stamping or laser cutting, for example. It is particularly advantageous that round actuator outer contours, for example, can also be manufactured without the need for subsequent processing of the stacked and sintered actuators using a material-removing operation, for example, drilling or turning. Actuators having a round outer contour are particularly well-suited for use in fuel injection valves, since they can be installed in the hollow cylindrical valve housing in a compact manner.

The frame area of the sheets is advantageously made of an external frame and a plurality of crossbars arranged in a row, to which the actuator areas are attached via the connecting webs. After stacking and sintering of the sheets, the individual actuators are separated from the stacks by separating the connecting webs via laser cutting or breaking, for example. The web segments to be separated are relatively short.

The electrodes are advantageously applied to the sheets so that they are at a predefined distance from the cutouts and from the external contours of the actuators. This ensures that the electrodes do not extend to the external surface of the actuators or to the central passage, thus being isolated from the area surrounding the actuators and from the fuel flowing through the central passage.

DRAWING

Embodiments of the present invention are illustrated in a simplified manner in the drawing and elucidated in detail in the following description.

FIG. 3 shows a processed sheet made of a piezoelectric ceramic material according to a second embodiment of the present invention; and FIG. 4 shows a section through an embodiment of a fuel injection valve having a piezoelectric actuator manufactured according to the present invention.

DESCRIPTION OF THE EMBODIMENTS

Figure 1:
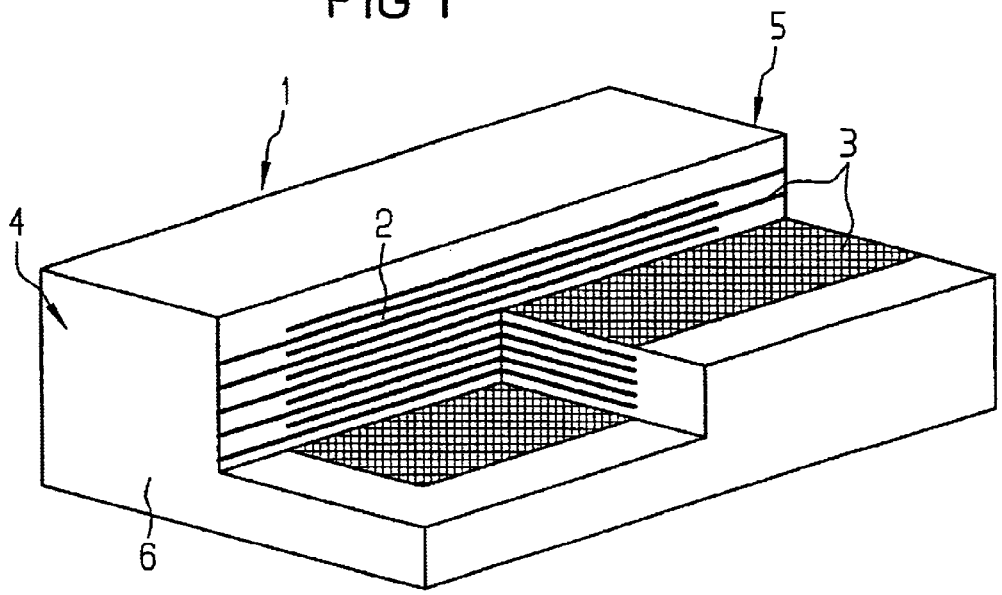
FIG. 1 shows a perspective cutaway view of a piezoelectric actuator according to the related art.

In order to better elucidate the present invention, FIG. 1 shows a stepwise sectioned view of a piezoelectric actuator 1 according to the related art.

Piezoelectric actuator 1 has ceramic block 2 made of a piezoelectric ceramic material, in which electrodes 3 are hi embedded. A printed circuit is located on sides 4 and 5 of piezoelectric actuator 1, with only printed circuit 6 on first side 4 being shown in FIG. 1. The printed circuit similarly present on second side 5 is not visible on FIG. 1. Every second electrode 3 is connected to a first printed circuit 6 provided on first side 4, while every first electrode 3 is connected to the printed circuits provided on second side 5. By applying an electric voltage between printed circuits 6 provided on sides 4 and 5, an electric field is obtained which, depending on the crystal orientation, results in expansion or contraction of piezoelectric actuator 1. This expansion or contraction may be used, for example, to actuate a valve closing body of a fuel injection valve.

One known manufacturing method for producing such piezoelectric actuators 1 includes initially manufacturing sheets from a piezoelectric ceramic material on whose surfaces electrodes 3 are applied by vapor deposition or sputtering, for example. Electrodes 3 are preferably applied so that electrodes 3 do not extend to the edge of what are to be actuators 1, but are separated from it by a predefined distance. Then the sheets with electrodes 3 applied are stacked and pressed together. Subsequently this stack of ceramic sheets is sintered in order to achieve a bond between the sheets, i.e., the sheets are baked to form ceramic block 2. A plurality of actuators 1 can be manufactured simultaneously with the individual actuators 1 being separated from one another by sawing, for example. The individual actuators 1 can be separated from one another even before sintering and the effective length of the actuators can be adjusted by pressing the individual actuators prior to sintering. After dividing up the stack to form the individual actuators, printed circuits 6 are applied to both sides 4 and 5 in order to connect electrodes 3 alternatingly to one another.

When piezoelectric actuators 1 are used to actuate a fuel injection valve, it is advantageous to provide a central passage through actuator 1 through which fuel can flow through actuator 1. Previously this central passage was provided using a material-removing operation, drilling in particular, in the finished actuator. In this case the internal wall of the passage had to be post-processed using a finishing operation in order to prevent short-circuits, caused by the drilling, between the electrodes. Furthermore, it is advantageous to provide actuators 1 with a round external contour in order to more easily integrate actuators 1 in a hollow tubular valve housing of the fuel injection valve. However, by sawing the stacks apart, rectangular actuators 1 are initially obtained. In order to achieve a round external contour, these rectangular actuators 1 must be subjected to a material-removing operation. Therefore, the subsequent processing of the actuators is relatively costly in the related art. Furthermore, only passages with a round internal contour can be obtained by drilling. In practice, however, there are applications in which it is desirable to form the passages with some other internal contour.

The present invention is based on the procedure described above, modifying it as described in the following.

In the method according to the present invention, a plurality of sheets made of a piezoelectric ceramic material are also initially manufactured and coated with electrodes 3, for example, by vapor deposition or sputtering. Then the sheets are stacked one above the other, pressed together and sintered. Finally, the stack is separated to form the individual actuators.

Contrary to the related art, however, the central passage is not obtained by a subsequent material-removing operation, for example, drilling, but the sheets are provided with cutouts for each actuator prior to sintering and the sheets are arranged in stacking exactly flush one above the other. The cutouts provided for each actuator 1 form the central passage when the sheets are stacked one above the other.

Figure 2:
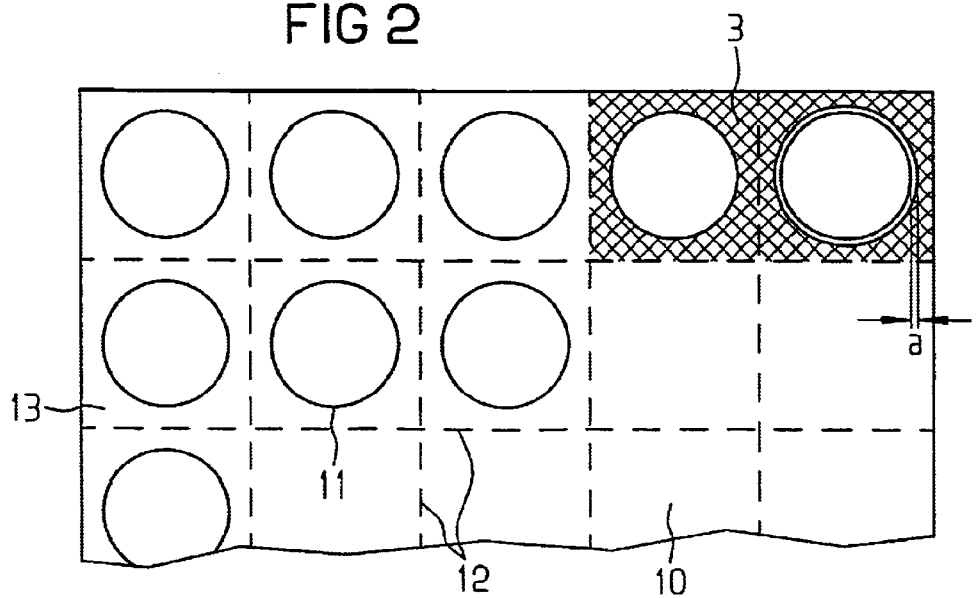
FIG. 2 shows a processed sheet made of a piezoelectric ceramic material according to a first embodiment of the present invention.

FIG. 2 shows a first embodiment of a sheet 10 made according to the present invention from a ceramic material. A round cutout 11 can be seen in the embodiment of FIG. 2. Each cutout 11 is assigned to one of what are to be actuators 1. Sheet 10 has a plurality of actuator areas 13 separated from one another by broken lines 12. After stacking sheets 10 one above the other and sintering stacked sheets 10, actuator areas 13 can be separated via sawing or laser cutting, for example, so that the individual actuators 1 are separated from one another. The exact alignment of individual sheets 10 one above the other so that cutouts 11 of stacked sheets 10 form a passage having a smooth wall is important.

Cutouts 11 can be applied by stamping or laser cutting, for example. Electrodes 3 can be applied to the entire surface of sheets 10 during the coating operation. However, the areas of cutouts 11 are advantageously removed prior to coating, so that electrodes 3 are separated from cutouts 11 by a predefined distance a. It is furthermore advantageous if electrodes 3 having cutouts on the side on which electrodes 3 are connected to printed circuit 6 are at a distance from separating line 12 so that the electrodes 3 are isolated both outward and from the passageway formed by cutouts 11.

FIG. 3 shows a top view of the second embodiment of a sheet 10 made of a piezoelectric ceramic material, with piezoelectric actuators 1 also in this case being manufactured by stacking these sheets 10 and subsequently sintering sheets 10. Contrary to the embodiment illustrated in FIG. 2, not only the internal contour of actuators 1, defined by the shape of cutouts 11, but also their external contour 14 is obtained by processing sheets 10 prior to stacking them. For this purpose not only cutouts 11 from sheets 10, but also additional elements 15 are made by laser cutting or stamping, for example, so that actuator areas 3 are connected to a frame area 17 of sheet 10 only by the remaining connecting webs 16. Elements 15 can also be separated by laser cutting or stamping.

Frame area 17 of sheet 10 includes in the embodiment illustrated a peripheral external frame 18 and crossbars 19 arranged in rows in the external frame. In the top area of FIG. 3, circular actuator areas 3 are connected to external frame 18 or crossbars 19 via a single connecting web 16. In the bottom area of FIG. 3, which shows a variation of this embodiment, actuator areas 3 are connected to crossbars 19 or external frame 18 via two diametrically opposite connecting webs 16. While each actuator area 3 is connected to frame area 17 in a particularly stable manner via two connecting webs 16 as shown in the bottom area of FIG. 3, the embodiment shown on the top of FIG. 3 has the advantage that actuator areas 3 can being relatively easily separated from frame area 17 after joining and sintering sheets 10 by breaking the only connecting web 16.

After joining sheets 10 and sintering, the individual actuators 1 are separated from frame area 17 by breaking, sawing, cutting, or laser cutting, for example. Actuator areas 3 are separated from frame area 17 along separating surfaces 20 marked by dashed lines. According to one advantageous embodiment, printed circuits 6 can be applied to separating surfaces 20 of connecting webs 16 after separation to connect electrodes 3.

In order to align sheets 10 exactly flush when stacking, frame 17 has a centering hole 22 on at least two corners; this centering hole 22 is formed on an extension 21 protruding from the corner of frame 17. The at least two centering holes 22 allow sheets 10 to be positioned exactly one over the other, for example, by interacting with guide rods introduced in both centering holes 22.

FIG. 4 shows a section through an embodiment of fuel injection valve 30, equipped with a piezoelectric actuator 1 manufactured according to the present invention. As described above, actuator 1 has a central passageway 31, which is formed by arranging cutouts 11 in each sheet 10 one above the other.

Piezoelectric actuator 1 is in contact with a cover element 32 of valve housing 33 and actuates a valve needle 34, on which a valve closing body 35 is formed in one piece in this embodiment. Valve closing body 35 forms, together with a valve seat 36 connected to valve housing 33, a sealing seat. When piezoelectric actuator 1 is actuated, it expands and actuates valve closing body 35 via valve needle 34 so that valve closing body 35 lifts from valve seat body 36 and fuel injection valve 30 opens. When the electrical voltage exciting actuator 1 is turned off, a restoring spring 37 guides valve closing body 35 back into its closed position.

Fuel is supplied through a fuel inlet opening 47 formed in cover elements 32. Fuel then flows through passageway 31 of piezoelectric actuator 1 and through openings 38 in a flange 39 of valve needle 34 into a spring support space 40, so that fuel finally reaches the sealing seat. The design of fuel injection valve 30 is considerably simplified by the fact that fuel flows through the center of piezoelectric actuator 1. In addition to circular passageways 31, other internal contours of passageways 31, for example, a rectangular or star-shaped internal contour, can also be easily manufactured using the manufacturing method according to the present invention.

What is claimed is:

1. A method of manufacturing a plurality of piezoelectric actuators, comprising:
   manufacturing sheets from a piezoelectric ceramic material;
   coating at least one surface of each of the sheets with electrodes;
   providing each of the sheets with at least one cutout for each of the actuators;
   after the providing step, stacking and pressing the sheets to form a stack, the cutouts of the sheets being arranged flush, one above the other, during the stacking;
   sintering the stacked sheets; and
   dividing the stack to form the actuators;
   wherein the cutouts are provided so that each of the piezoelectric actuators has a continuous longitudinal opening to provide a tubular piezoelectric actuator.

2. The method according to claim 1, further comprising: pre-forming external contours of the actuators in the sheets before the step of stacking and pressing.

3. The method according to claim 1, wherein the providing steps includes providing the at least one cutout by stamping or laser cutting.

4. The method according to claim 1, wherein the electrodes are applied so that the electrodes have a predefined distance from at least one of: i) the cutouts, and ii) external contours of the actuators.

5. A method of manufacturing a plurality of piezoelectric actuators, comprising:
   manufacturing sheets from a piezoelectric ceramic material;
   coating at least one surface of each of the sheets with electrodes;
   providing each of the sheets with at least one cutout for each of the actuators;
   after the providing step, stacking and pressing the sheets to form a stack, the cutouts of the sheets being arranged flush, one above the other, during the stacking;
   sintering the stacked sheets;
   dividing the stack to form the actuators; and
   forming in the sheets a frame area and connecting webs which connect actuator areas to the frame area.

6. A method of manufacturing a plurality of piezoelectric actuators, comprising:
   manufacturing sheets from a piezoelectric ceramic material;
   coating at least one surface of each of the sheets with electrodes;
   providing the sheets with at least one cutout for each of the actuators;
   after the providing step, stacking and pressing the sheets to form a stack, the cutouts of the sheets being arranged flush, one above the other, during the stacking;
   sintering the stacked sheets;
   dividing the stack to form the actuators; and
   forming in the sheets a frame area and connecting webs which connect actuator areas to the frame area;
   wherein two of the connecting webs arranged diametrically opposite each other are associated with each actuator area.

7. The method according to claim 5, wherein the actuator areas have a circular shape.

8. A method of manufacturing a plurality of piezoelectric actuators, comprising:
   manufacturing sheets from a piezoelectric ceramic material;
   coating at least one surface of each of the sheets with electrodes;
   providing the sheets with at least one cutout for each of the actuators;
   after the providing step, stacking and pressing the sheets to form a stack, the cutouts of the sheets being arranged flush, one above the other, during the stacking;
   sintering the stacked sheets;
   dividing the stack to form the actuators; and
   forming in the sheets a frame area and connecting webs which connect actuator areas to the frame area;
   wherein the frame area of the sheets includes one external frame and crossbars arranged in a row in the external frame, the connecting webs connecting the actuator area to the crossbars or to the external frame.

9. The method according to claim 8, wherein the sheets are centered during stacking using centering holes provided in the frame area of the sheets.

10. The method according to claim 9, further comprising: after sintering, rupturing the connecting webs along a separating surface.

11. The method according to claim 10, wherein the rupturing step includes one of sawing, cutting, laser cutting and breaking the connecting webs.

12. The method according to claim 10, wherein at least one printed circuit is applied to the separating surfaces of the connecting webs after separation to connect the electrodes.

* * * * *

UNITED STATES PATENT AND TRADEMARK OFFICE
CERTIFICATE OF CORRECTION

PATENT NO. : 6,698,072 B1
DATED : March 2, 2004
INVENTOR(S) : Hubert Stier et al.

It is certified that error appears in the above-identified patent and that said Letters Patent is hereby corrected as shown below:

Title page,
Item [57] ABSTRACT, delete "(1),(10), (10), (3), (10), (1), (11), (1), (10), (11), (10) "

Column 1,
Line 5, change "Background Information" to -- Field of Invention --
Line 6, change "is based on" to -- relates to --
Line 8, change "valves, according to... claim" to -- valves. --
Line 10, insert -- Background Information --
Line 11, change "are known in a plurality of designs," to -- are described, --
Line 12, change "example from Application 195 00 705 A1 " to -- example, in Application No. 195 00 705 --
Line 13, change "Patent 43 06 073 C1." to -- Patent No. 43 06 073. --
Line 20-21, change "Application 37 13 697 A" to -- Application No. 37 13 697, --
Line 26, change "Application 195 34 445 A1" to -- Application No. 195 34 445 --
Line 40-41, change "previously this central passage was usually" to -- this central passage was conveniently --
Line 44, change "Previously" to -- Conventionally, --
Line 63, change "Advantages of the Invention" to -- Summary --
Line 65-66, delete "having the characterizing features of Claim 1"
Line 66, delete "over the related art"

Column 2,
Line 16-18, delete "The measures... in Claim 1."
Line 22-23, change "so that these have" to -- so that there is --
Line 56-58, delete "Embodiments... description."
Line 60, change "the related art;" to -- the related art, --
Line 62, change "made of a piezoelectric" to -- made of a conventional piezoelectric --
Line 64, change "present invention;" to -- present invention, --
Line 67, change "present invention; and" to -- present invention, --

Column 3,
Line 5, change "Description of the Embodiments" to -- Detailed Description --
Line 7, delete "In order... invention,"
Line 8, change "of a piezoelectric actuator" to -- of a conventional piezoelectric actuator --
Line 9, change "1, according to the related art." to -- 1. --
Line 24, change "One known manufacturing" to -- One conventional manufacturing --
Line 28, change "Electrodes 3 are preferably applied" to -- Electrodes 3 are, for example, applied --
Line 30, change "Then the sheets" to -- then, the sheets --

UNITED STATES PATENT AND TRADEMARK OFFICE
CERTIFICATE OF CORRECTION

PATENT NO. : 6,698,072 B1
DATED : March 2, 2004
INVENTOR(S) : Hubert Stier et al.

It is certified that error appears in the above-identified patent and that said Letters Patent is hereby corrected as shown below:

Column 4,
Line 2, change "sputtering. Then the" to -- sputtering. Then, the --
Line 6, change "the related art," to -- the conventional methods, --

Signed and Sealed this

Fifth Day of April, 2005

JON W. DUDAS
*Director of the United States Patent and Trademark Office*